United States Patent
Smith

(10) Patent No.: US 7,561,645 B2
(45) Date of Patent: Jul. 14, 2009

(54) METHOD AND APPARATUS FOR REDUCING FREQUENCY ERRORS ASSOCIATED WITH AN INTER-SYSTEM SCAN

(75) Inventor: Alan Andrew Smith, Farnborough (GB); Julie Stuart, legal representative, Longfield (GB)

(73) Assignee: Qualcomm Incorporated, San Diego, CA (US)

( * ) Notice: Subject to any disclaimer, the term of this patent is extended or adjusted under 35 U.S.C. 154(b) by 707 days.

(21) Appl. No.: 10/529,434

(22) PCT Filed: Sep. 24, 2003

(86) PCT No.: PCT/GB03/04179

§ 371 (c)(1),
(2), (4) Date: Aug. 24, 2005

(87) PCT Pub. No.: WO2004/030232

PCT Pub. Date: Apr. 8, 2004

(65) Prior Publication Data

US 2006/0111141 A1 May 25, 2006

(30) Foreign Application Priority Data

Sep. 26, 2002 (GB) ................................ 0222379.0

(51) Int. Cl.
*H04B 7/10* (2006.01)
*H04L 1/02* (2006.01)
(52) U.S. Cl. ....................................... 375/347; 375/349
(58) Field of Classification Search ......... 375/371–376, 375/346–350; 327/153–163
See application file for complete search history.

(56) References Cited

U.S. PATENT DOCUMENTS

| 4,112,375 | A | * | 9/1978 | Schittko et al. .......... 455/196.1 |
| 5,519,887 | A | | 5/1996 | Lieu |
| 5,841,396 | A | | 11/1998 | Krasner |
| 6,019,304 | A | | 2/2000 | Skowronski |

(Continued)

FOREIGN PATENT DOCUMENTS

JP          8-317446 A      11/1996

(Continued)

*Primary Examiner*—Curtis B Odom
(74) *Attorney, Agent, or Firm*—Nicholas J. Pauley; Abdullah Katbab; Darren Simon

(57) ABSTRACT

A plural-mode receiver 10 is able to receive signals from a first communication system (e.g. WCDMA) or signals from a second, different communication system e.g. GSM). The receiver 10 comprises a first receiver chain 13, 15,17,19 for receiving signals of the first communication system and a second receiver chain 12, 14, 16, 18 for receiving signals of the second communication system. A reference oscillator 24 is arranged to generate a reference signal for the first receiver chain and the second receiver chain. The receiver also comprises a controller 22 for controlling the reference oscillator 24 so that the oscillator 24 oscillates at frequencies related to signals of the first communication system or signals of the second communication system. The controller 22 records the change in frequency of the oscillator 24 resulting from changing to the frequencies related to signals of the second communication system and a period of time during which signals of the second communication system are received by the second receiver chain. The controller 22 then calculates from the recorded change and the recorded period of time an error vector and changes parameters of the reference oscillator 24, including applying the calculated error vector, so that the oscillator oscillates at frequencies related to signals of the first communication system.

33 Claims, 4 Drawing Sheets

U.S. PATENT DOCUMENTS 6,122,506 A 9/2000 Lau
2002/0122140 A1* 9/2002 Cowley ..................... 348/731
2002/0127988 A1 9/2002 Humes

FOREIGN PATENT DOCUMENTS

WO 02/060064 8/2002

* cited by examiner

METHOD AND APPARATUS FOR REDUCING FREQUENCY ERRORS ASSOCIATED WITH AN INTER-SYSTEM SCAN

BACKGROUND OF THE INVENTION

I. Field of the Invention

The invention relates generally to a method of and apparatus for reducing frequency errors associated with an inter-system scan. The invention is useful for reducing frequency error when performing an intersystem scan between a continuous frequency division duplex system, for example a WCDMA system, and a differently duplexed system, for example a time division duplex system such as GSM, but is not limited to such an application.

II. Description of the Related Art

In the following, reference will be made to the WCDMA and GSM standards, but it will be appreciated by those possessed of the relevant skills that the invention is not limited to those standards and may be applied to inter-system scans between other different communication systems. The terms "mobile unit" and "mobile phone" are also used and, of course, cover mobile phones, but also cover other devices capable of communicating with a cellular system in the transfer of voice or information data.

Most if not all equipment used in communications systems includes an internal frequency reference circuit that is adjustable to allow the equipment to adjust the timing of its operations to align with that of other equipment within the communications system. For example in a cellular telephone system the mobile units include a reference frequency circuit, which is commonly an adjustable oscillator whose output frequency can be trimmed within a specified range using an control voltage input, to enable the timing within the mobile unit to be aligned with that of the serving cell or network. The frequency reference circuit is commonly a phase-locked loop based around a voltage controlled temperature compensated crystal oscillator (VCTCXO), an accurate oscillator that allows the range to be specified in terms of parts per million (ppm).

The mobile unit will, of course, be in communication with the system when it is active during a call. The system needs to "know" where the mobile unit is when it is not receiving or making a call so that incoming messages can be sent to it. Mobile units therefore continue to operate in an idle mode when a call is not being made so that data can -be paged to it from time to time. The mobile unit has to maintain time alignment with the WCDMA system, in order to correctly monitor for paging data from the system for the mobile unit. The VCTCXO and phase-locked loop are usually very accurate and need only be subjected to very minor corrections, essentially remaining at a constant frequency while the phone remains in active or idle communication with the system.

During certain situations, for example when leaving the coverage area of an initial system and entering the coverage area of a new system, it becomes necessary to monitor the signals of the surrounding cells belonging to the new system so that a controlled handover can take place between the two systems. While it would be possible to do this from within the system, such an approach would place an undue burden on the system because it would have to monitor both active and idle mobile units. The mobile units themselves therefore do this monitoring.

There are many different standards available for use in cellular communications systems including the widely established GSM standard and the newer CDMA standards including WCDMA. System users expect to have continuous service even when they roam outside the area of coverage of the service company to which they subscribe. In order to meet this expectation, so called multi-mode phones have been developed that are capable of communication in, say, both a WCDMA system and a GSM system.

The continuous nature of WCDMA signals means that there is no natural break in the signals that would allow scanning for signals from other systems. Furthermore, there is no common synchronization between a WCDMA system and a GSM system. Different systems are asynchronous in that there is no predefined relationship between the timing and phase of the signals of the systems.

One way of overcoming this would be to apply a post-reception phase correction to the data before decoding is done. This could be done by using a hardware rotator to correct for phase offset as the received data is sampled, i.e. receive a sample, rotate it and then store it in memory for decoding. A problem with this approach is that a hardware rotator requires additional hardware, and hence uses extra silicon area, and therefore adds additional cost and complexity to the circuit (which is usually provided in the form of an ASIC).

Another way would be to rotate the received samples in memory before the decoding takes place, i.e. bring in all of the samples and then apply a rotation algorithm. A problem with this approach is that a signal processing rotation algorithm such as this requires code to be written, memory in which to store it and a DSP (digital signal processor) powerful enough to run it in the required time. This approach therefore consumes DSP memory and energy from the battery.

One proposal for the WCDMA standard to overcome this problem is to use a method known as compressed mode to create "free-space" periods during which the receiver can be re-configured to scan for other systems. Thus, during a free space period, the receiver is tuned to a GSM channel and a measurement of characteristics of the channel is performed. At the end of a "free-space" period, the receiver must be configured back to the WCDMA channel of the original system in order to ensure uninterrupted service. In order to do this, the receiver needs to be phase locked before reception is attempted Therefore, the phase-locked loop (or other reference oscillator) must be re-tuned and re-synchronized both when changing the phone from WCDMA to GSM and when changing the phone from GSM back to WCDMA.

When the phone is retuned to scan for other serving systems, a number of actions have to occur:

1. Initialize receiver and re-program PLL to new (GSM) frequencies.
2. Scan for data to give coarse frequency synchronization.
3. Scan for data to give fine frequency correction.
4. Decode GSM system access parameters.
5. Re-configure receiver and re-program PLL to original (WCDMA) frequencies.
6. Re-acquire and re-synchronize to the WCDMA system.

This retuning results in a frequency error being introduced into the synchronization of the phone to the WCDMA system, making the re-acquisition more difficult when returning to the WCDMA channel. One proposal for reducing this problem when switching between GSM and WCDMA modes is to extend the free space period as much as possible for the GSM scan, to minimize the response time of circuits, and to rely on the receiver to re-synchronize using an frequency or time tracking auto frequency control (AFC) algorithm.

However, this approach is not entirely satisfactory at least for the following reason. When the scanning for data occurs in the above actions 2 and 3, the phase-locked loop is fine-tuned using a control voltage input. This fine-tuning results in a frequency error being introduced into the synchronization when the phone is reconfigured to return to the WCDMA system in the above action 5. Consequently, the re-acquisition in action 6 is more difficult to perform.

SUMMARY OF THE INVENTION

The invention addresses the above-discussed and related problems.

According to one aspect of the invention there is provided a method of controlling a plural-mode receiver, capable of receiving signals from a first communication or signals from a second, different communication system, to reduce frequency errors associated with the receiver scanning for signals of the second communication system while receiving signals of the first communication system, the method comprising: changing parameters of a reference oscillator of the receiver so that the oscillator oscillates at frequencies related to signals of the second communication system; recording the change in frequency of the oscillator resulting from the adjustment; receiving signals of the second communication system for a period of time; recording the period of time; calculating from the recorded change and the recorded period of time an error vector; and changing parameters of the reference oscillator, including applying the calculated error vector, so that the oscillator oscillates at frequencies related to signals of the first communication system.

According to another aspect of the invention there is provided a plural-mode receiver apparatus for receiving signals from a first communication or signals from a second, different communication system, the apparatus comprising: a first receiver chain for receiving signals of the first communication system; a second receiver chain for receiving signals of the second communication system; a reference oscillator for generating a reference signal for the first receiver chain and the second receiver chain; and a controller for: changing parameters of the reference oscillator so that the oscillator oscillates at frequencies related to signals of the second communication system; recording the change in frequency of the oscillator resulting from the adjustment; recording a period of time during which signals of the second communication system are received by the second receiver chain; calculating from the recorded change and the recorded period of time an error vector; and changing parameters of the reference oscillator, including applying the calculated error vector, so that the oscillator oscillates at frequencies related to signals of the first communication system.

According to a further aspect of the invention there is provided a receiver for receiving signals of a first communication system and signals of a second communication system, the receiver comprising a receiving circuit tunable to receive signals of the first and second communication systems, the receiver being arranged so that, while tuned to receive signals of the first communication system, the receiving circuit can be briefly retuned to receive signals of the second communication system before being tuned back to receive again signals of the first communication system, and so that a correction is made when tuning back to signals of the first communication system depending on tuning changes made while retuning and receiving signals of the second communication system and the duration of the changes.

The invention also provides a method of receiving signals of a first communication system and signals of a second communication system, the method comprising tuning a receiving circuit to receive signals of the first communication system, retuning the receiving circuit to receive signals of the second communication system, tuning the receiver back to receive again signals of the first communication system, determining tuning changes made while retuning and receiving signals of the second communication system and the duration of the changes, calculating from the changes and duration of the changes a correction to be made to the tuning, and making the calculated correction when tuning back to signals of the first communication system.

As will be appreciated from the following description of a receiver in which the invention is embodied, if the reference oscillator is allowed temporarily to achieve phase lock with the new system and just receive the samples as normal, i.e. allow the reference oscillator to become phase locked before starting the received data sampling, then the received samples will have the correct phase and no post correction will be required. This approach requires very little overheads in circuit complexity, memory space and energy consumption.

Furthermore, the problem of maintaining phase lock with the continuous frequency division duplex (e.g. WCDMA) system while temporarily achieving phase lock with the GSM system is overcome or at least mitigated by estimating the error induced by retuning to the time division duplex (e.g. GSM) system in order to apply a correction for it before the WCDMA system is re-acquired. The correction can be computed before (or during) the inter-system scan and applied during the receiver reconfiguration period, so that when the WCDMA system is re-acquired, the error will already have been substantially reduced.

The above and further features of the invention are set forth with particularity in the appended claims and together with advantages thereof will become clearer from consideration of the following detailed description of an exemplary embodiment of the invention given with reference to the accompanying drawings.

DETAILED DESCRIPTION OF AN EMBODIMENT OF THE INVENTION

Figure 1:
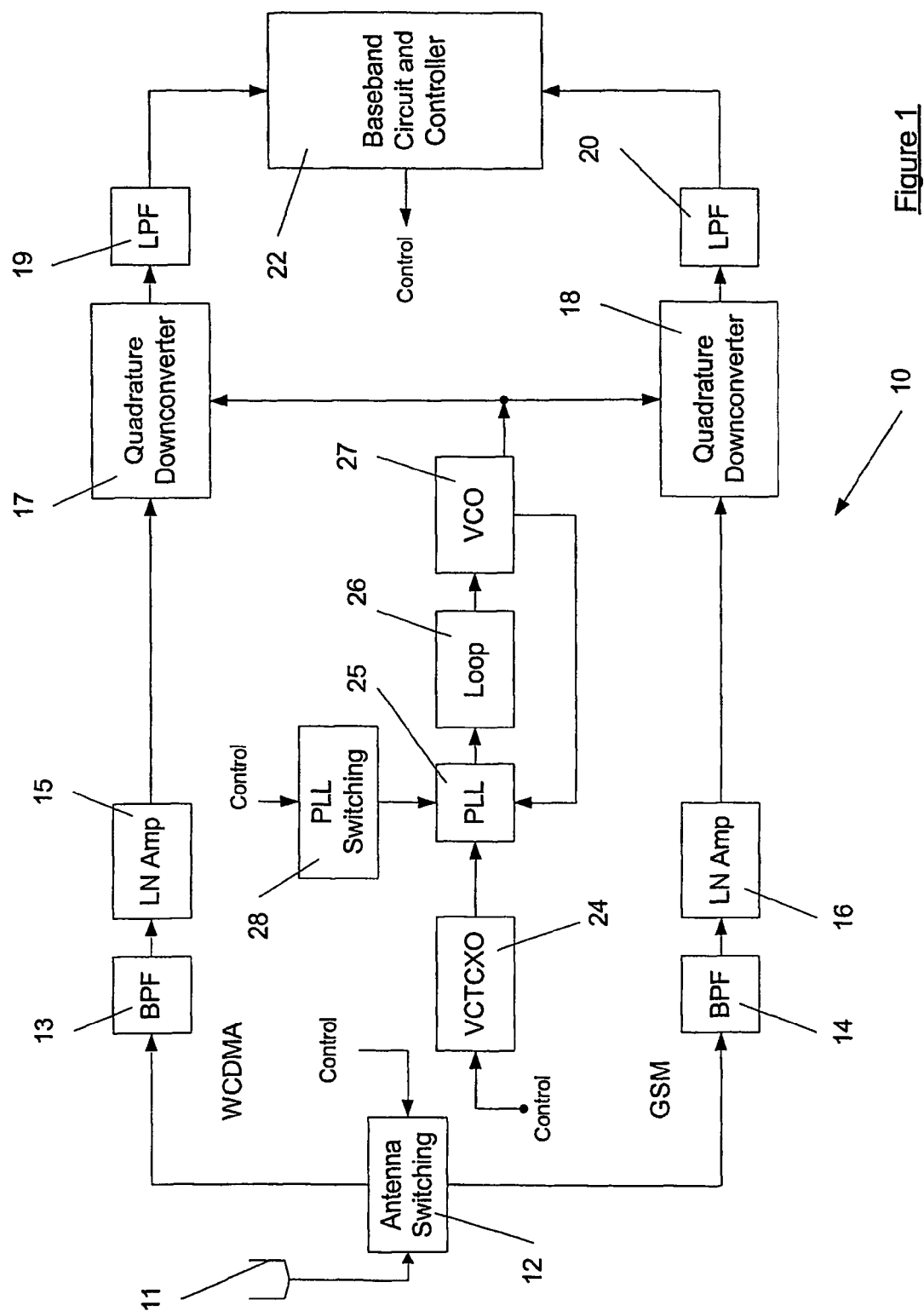
FIG. 1 is a schematic circuit diagram of a dual mode receiver for a mobile unit.

FIG. 1 is a schematic circuit diagram representing a dual mode receiver 10 for a mobile unit. For the purpose of explanation the dual mode receiver 10 is illustrated as being capable of receiving either WCDMA or GSM signals. It will be appreciated that other combinations of receivable signals are possible. Signals received at an antenna 11 are switched by a switching component 12 to either a WCDMA receiver chain (shown in the upper part of FIG. 1) or a GSM receiver chain (shown in the lower part of FIG. 1). Both receiver chains operate in essentially the same way insofar as the received signal is: filtered by a bandpass filter (BPF) 13,14; amplified by a low noise amplifier 15,16; down-converted to a baseband frequency by a down-converter 17,18; and filtered by a low-pass filter 19,20 before being input to a baseband circuit and controller 22 for further processing.

The receiver 10 also comprises a voltage controlled temperature compensated crystal oscillator (VCTCXO) 24 that provides a reference frequency signal to a phase-locked loop.

The phase-locked loop comprises a phase-locked loop integrated circuit (PLL) 25 (to be described in detail herein blow), a loop filter 26 and a voltage-controlled oscillator 27. The phase-locked loop generates a signal at a suitable frequency to enable the down-converter 17, 18 in both the WCDMA and GSM receiver chains to down-convert the received signals to a baseband level. This use of a phase-locked loop is well known and need not be described in greater detail herein.

In addition to the aforementioned processing of down-converted signals, the baseband circuit and controller 22 also controls operation of the receiver 10. The baseband circuit and controller 22 typically comprises a control processor (not shown) that generates signals to cause the antenna switching component 12 to switch between the WCDMA chain and the GSM chain at the required time. The controller-generated signals are applied to, among other things, the antenna switching component 12 and a PLL switching controller 28, which controls operation of the phase-locked loop.

Normally, a dual-mode receiver circuit would require a separate phase-locked loop for each of the WCDMA and GSM receiver chains. However, as shown in FIG. 1, a single switchable phase-locked loop of the kind described in international (PCT) patent application PCT/GB01/05610 may advantageously be used to provide a signal to either of the down-converter 17, 18 in the WCDMA and GSM receiver chains since the two receiver chains are never required to operate simultaneously.

Figure 2:
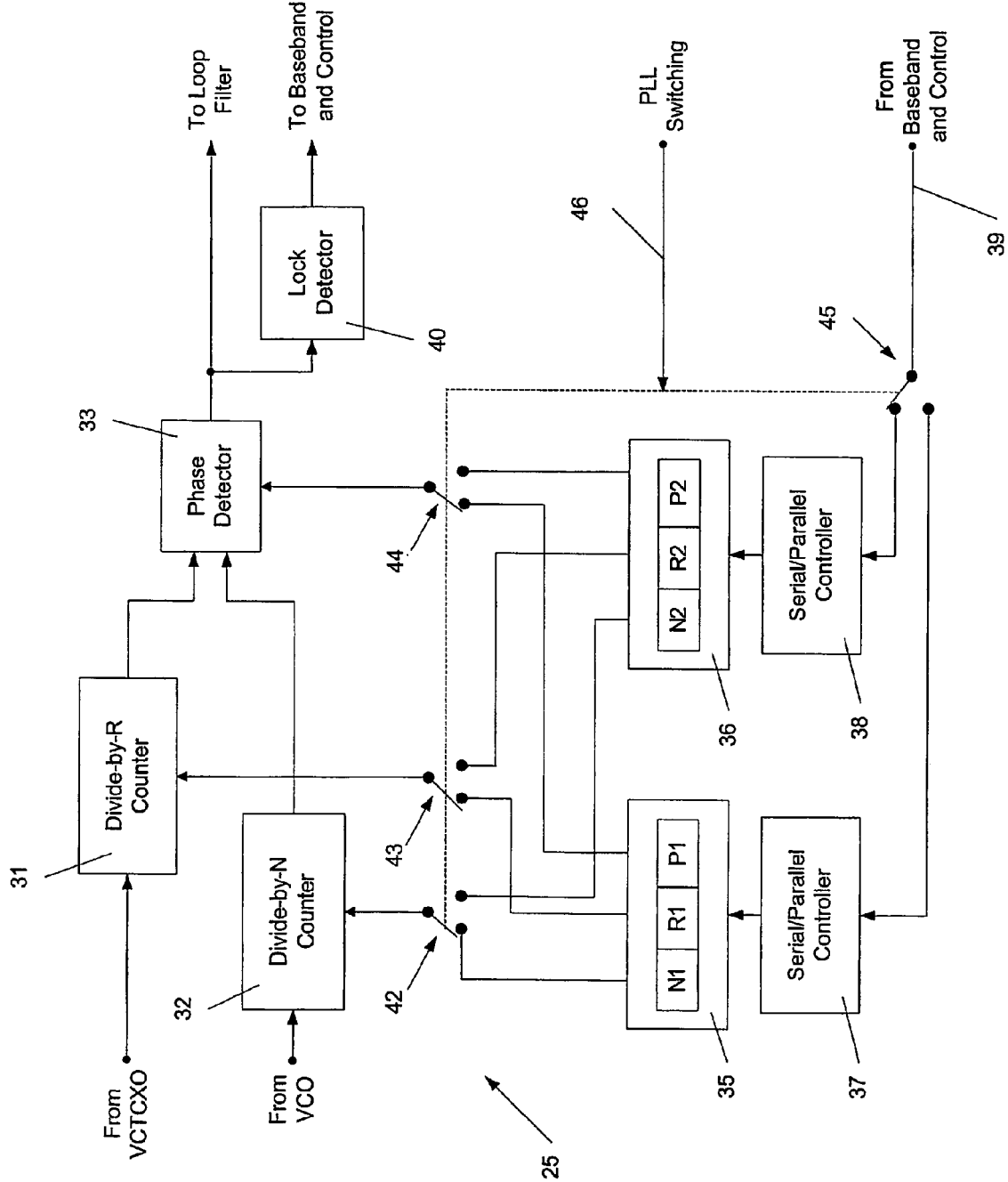
FIG. 2 is a schematic circuit diagram of a phase-locked loop in the receiver of FIG. 1.

FIG. 2 of the accompanying drawings is a schematic circuit diagram representing in greater detail the PLL 25 of FIG. 1. The PLL 25 shown in FIG. 2 may be essentially the same as described in the aforementioned international (PCT) patent application PCT/GB01/05610. The PLL 25 comprises a programmable divide-by-R counter 31, a programmable divide-by-N counter 32 and a phase detector 33. The divide-by-R counter 31 is driven by the VCTCXO (see FIG. 1). Two register sets 35,36, each store data defining a respective configuration for the PLL 25. Each register set 35,36 has an associated serial/parallel converter 37,38 connected to receive data in serial form from the baseband circuit and control 22 via a serial data interface 39. Each register set 37,38 comprises a register 37R,38R for holding data for the divide-by-R counter 31, a register 37N,38N for holding data for the divide-by-N counter 32 and a register 37P,38P for holding data for the phase detector 33. The phase detector data in the registers 37P,38P defines the gain applied by the phase detector 33.

Also shown in FIG. 2 is a lock detector 40 coupled to the phase detector 33 for providing an indication to the baseband circuit and control 22 when the PLL 25 has locked onto the desired frequency, i.e. when it has become stable. Switches 42,43 and 44 are provided to switch the divide-by-R counter 31, the divide-by-N counter 32 and the phase detector 33 between the two register sets 37,38. A further switch 45 is provided to switch the serial data interface 39 from the baseband circuit and control 22 between the two serial to parallel converters 37,38. All of the switches 42 to 45 are controlled by a configuration select control signal 46 generated by the baseband circuit and controller 22.

The switches are arranged so that when the first register set 35 is coupled to the divide-by-R counter 31, the divide-by-N counter 32 and the phase detector 33, the second register set 36 is coupled via the switch 45 to the serial data interface 39 from the host microcontroller, and when the second register set 36 is connected to the divide-by-N counter 17, etc, the first register set 35 is connected to the serial data interface 39. In this way, one set of registers 36,37 can be loaded with new data while the other set of registers 36,37 is controlling operation of the divide-by-N counter 31, etc. This provides an efficient way of switching between different frequencies by reducing the amount of time that the PLL is inactive.

Figure 3:
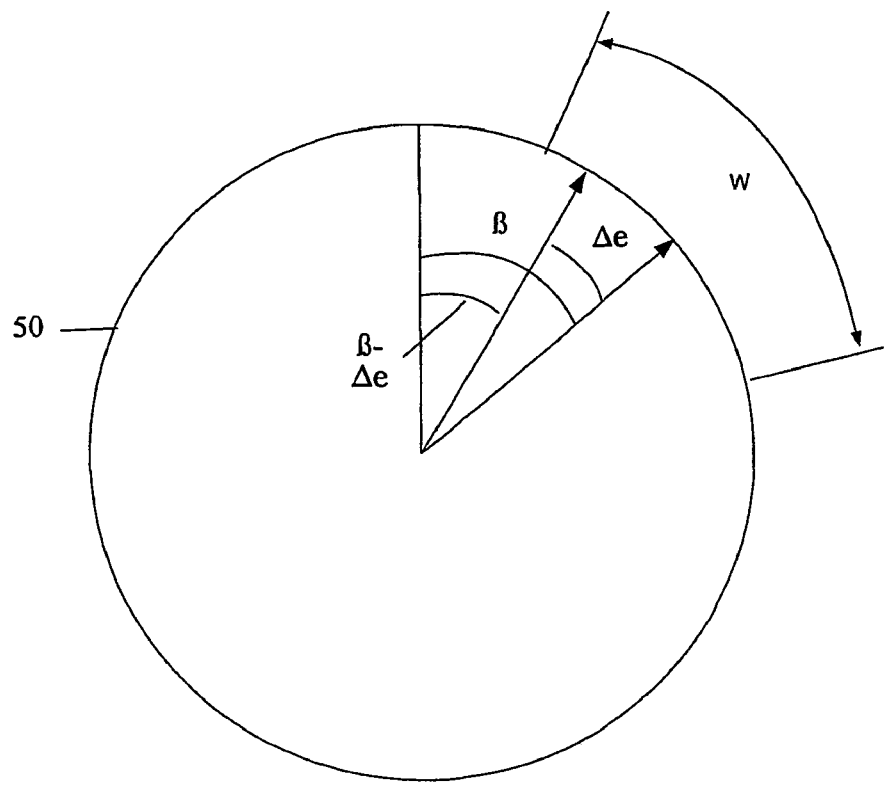
FIG. 3 is a phase diagram in PN space.
Figure 4:
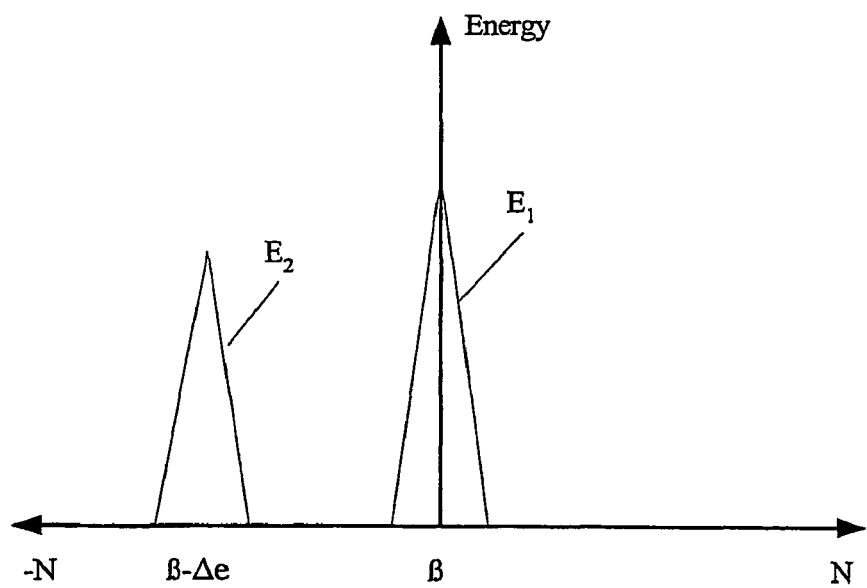
FIG. 4 is a graph showing energy curves in PN space.

FIG. 3 of the accompanying drawings is a phase diagram in PN space, where the circumference of the circle 50 represents an entire PN sequence. Only part of the PN sequence is assigned to a mobile unit and that part is centered in a search window W. When the phase (in PN space) of the signal generated by the phase-locked loop is centered on the window W at code position β the energy ($E_b/N_o$) in the received signal will be at a maximum. This is represented by the energy curve $E_1$ in FIG. 4. When the phase of the signal from the phase-locked loop changes so that the signal is off center in the window W at position β-Δe the energy ($E_b/N_o$) in the received signal will be at a lower level as represented by the curve $E_2$ in FIG. 4. As long as the phase of the signal from the phase-locked loop does not move out of the search window W, the signal will be recoverable, even at a lower level of energy. However, if the phase changes to the extent that the signal lies outside the search window W, the receiver will no longer be locked onto the received signal and reception will be lost. Put another way the value of Δe should not be greater than ½W.

The receiver of FIG. 1 includes correlators (not shown) that correlate PN sequences in the received WCDMA signals with internally generated PN sequences in order to extract the correct data from the WCDMA signals if the clock source for the correlator (i.e. the phase-locked loop) is made to run faster than necessary, the PN generators will advance too quickly and, the correlation peak will appear to be behind in time. If the clock is made to run slow, the correlation peak will appear to be ahead in time because the PN generators will be running slower than expected. This can be thought of as the correlation peak "jumping" from its' aligned position to another position in the search window by an amount which is proportional to the net frequency error introduced by the alternate system scan.

When a mobile unit is in standby the frequency of the VCTCXO and hence the phase-locked loop may well drift away from the frequency of the WCDMA system. This will occur because of tolerances of manufacture and changes in the environment in which the mobile unit is located. As long as the drift does not result in a code phase difference greater than ½W, the mobile unit will be able to synchronize with the system when it comes out of the standby state. Mobile units are designed so that the drift is less than ½W.

As has been mentioned previously herein, the continuous nature of WCDMA signals means that there is no natural break in the signals that would allow scanning for signals from other systems. When a mobile unit is required to monitor the strength of signals from cells in a new system, the mobile unit has to receive and decode signals from the surrounding cells of the new system and process the network information carried by those signals. In order to do this, the receiver needs either to be phase locked before reception is attempted or to apply a post-reception phase correction to the data before decoding is done.

This is done in the receiver of FIG. 1 by allowing the phase-locked loop temporarily to achieve phase lock with the GSM signals before starting the received data sampling. This ensures that samples have correct phase and no post correction is required. When a mobile unit is in a steady WCDMA idle state, the VCTCXO and phase-locked loop are both frequency and phase locked to the WCDMA system. While in the idle state the mobile unit will "wake up" periodically to monitor its assigned paging messages from the WCDMA system. Therefore when scanning for GSM signals any induced frequency and phase errors introduced on to the reference oscillator by the surrounding cell scans must be corrected before the mobile unit next "wakes up" to monitor for WCDMA system paging message.

The phase-locked loop is therefore allowed to achieve lock using known automatic frequency control (AFC) techniques and while doing so, the magnitude and direction of the induced errors (an error vector) is monitored together with the durations that the errors are applied for. By summing these error vectors, a resultant error vector can be found and then used to apply a nullifying error of equal and opposite magnitude to the VCTCXO (see FIG. 1). Thus, by the time that the mobile unit next has to "wake up" to monitor for WCDMA system paging data, the VCTCXO and phase-locked loop will once again be aligned for the WCDMA system, as if no other activity had occurred.

Figure 5:
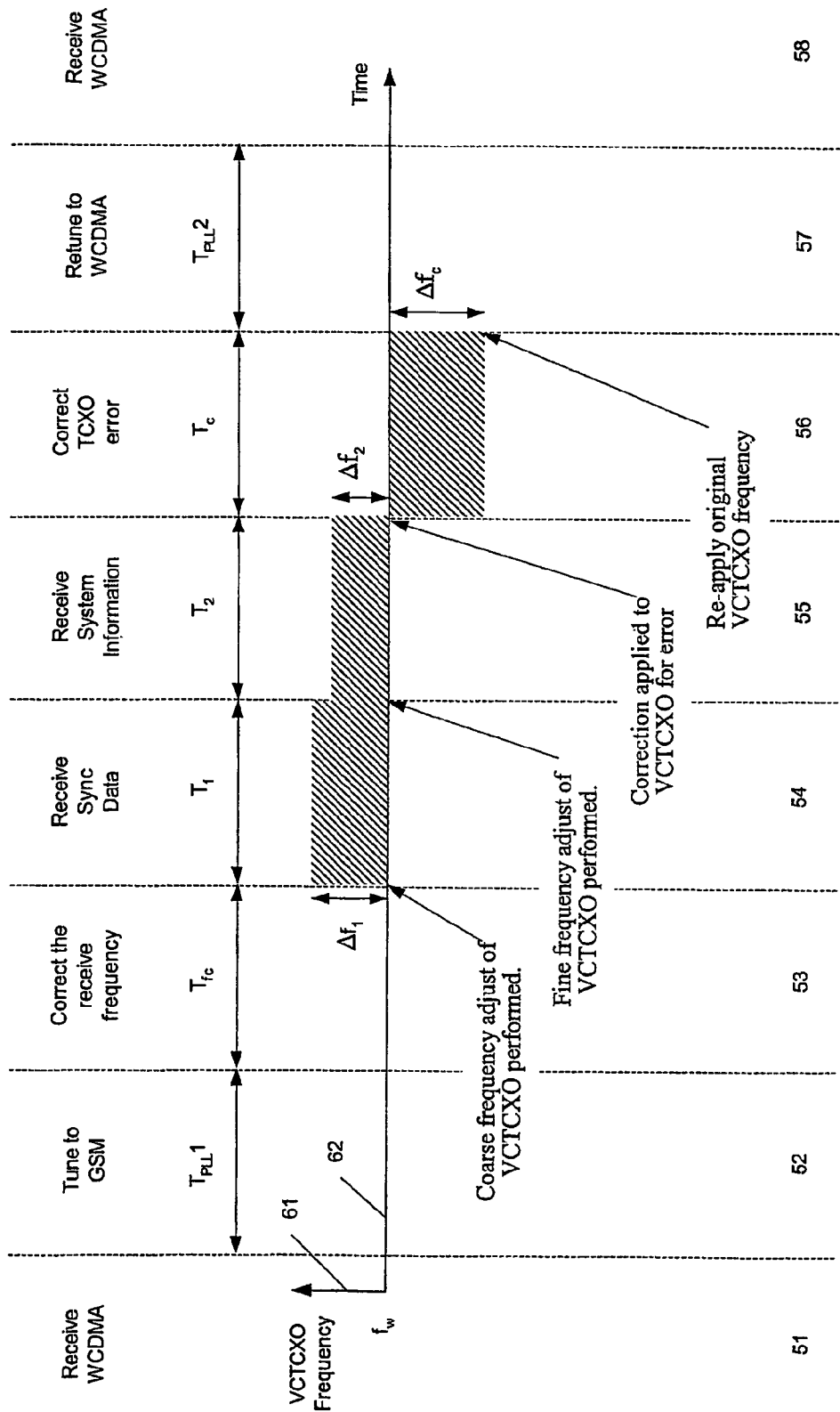
FIG. 5 shows one example of a timeline for an inter-system scan performed by the receiver of FIG. 1.

FIG. 5 of the accompanying drawings shows one example of a timeline for an inter-system scan performed by the receiver of FIG. 1. The timeline covers an initial state 51 and seven intervals labeled 52 to 58. Lines 61 and 62 represent frequency (VCTCXO frequency) and time axes respectively. In the initial state 51 the receiver is tuned to receive, and is receiving, WCDMA signals. In this state the frequency is at $f_w$, the receive frequency for the WCDMA signal.

In interval 52 which lasts for a time period $T_{PLL}1$ the receiver of FIG. 1 is initialized with data that will subsequently enable the GSM receiver chain to receive signals from a GSM system. The period of time $T_{PLL}1$ depends on characteristics of the phase-locked loop, but once the phase-locked loop has been designed this period will be essentially constant. Interval 53 represents the time $T_{fc}$ taken for the receiver to receive initial (coarse) frequency correction data. The length of time $T_{fc}$ taken to receive this information depends on external influences and is therefore indeterminate. Once the data has been received it may be stored in the control circuit for quicker access, the stored data being compared from time to time with updating data from the source (usually a system controller or base station) to ensure that it remains current. In intervals 52 and 53, the frequency remains at the receiving frequency $f_w$ of the WCDMA system.

At the end of interval 53, a coarse frequency adjustment is made depending on the received data, which data is applied to the phase-locked loop. This offsets the frequency of the signal output from the phase-locked loop by $\Delta f_1$ to give a frequency approximately equal to that of the GSM signals. This frequency offset is shown as a positive quantity in FIG. 5, but it could be a negative quantity. The frequency offset $\Delta f_1$ is applied for the whole of interval 54, corresponding to a time period $T_1$ during which better synchronization data is received and a better frequency offset estimation is calculated. At the end of interval 54, once a fine frequency offset $\Delta f_2$ (which can also be either positive or negative) has been calculated, the fine frequency offset $\Delta f_2$, is applied to the phase-locked loop. The fine frequency offset offsets the frequency of the signal output from the phase-locked loop by $\Delta f_1$ to give a frequency substantially equal to that of the GSM signals.

This marks the beginning of interval 55, which lasts for a time $T_2$. During interval 55 the receiver scans the GSM signal domain, and receives and decodes the GSM system information. The values of $T_1$ and $T_2$ are not fixed, because of the asynchronous nature of the signal reception during intervals 54 and 55, but $T_1$ and $T_2$ can be measured by the controller as they happen. The controller therefore also calculates a cumulative frequency error, which is the error introduced during the intervals 54 and 55, and calculates how long it will take ($T_c$) for a corrective frequency offset $\Delta f_c$ to cancel that cumulative frequency error. The corrective frequency offset $\Delta f_c$ is therefore applied in interval 56 for a period of $T_c$ seconds.

By the end of interval 56 there will be substantially no frequency error in the operation of the phase-locked loop. Therefore in interval 57 the receiver is reconfigured so that the WCDMA receive chain is again receiving WCDMA signals from the WCDMA system. There is a short delay of duration before the receiver settles into a steady state and this is represented by the time period $T_{PLL}2$. Like $T_{PLL}1$ the period of time $T_{PLL}2$ depends on characteristics of the phase-locked loop, but is essentially constant.

The corrective frequency offset $\Delta f_c$ is calculated in the following manner. The cumulative error $\Delta \beta$ introduced during intervals 54 and 55 is a function of both frequency and time. Therefore:

$$\Delta\beta = T_1 \cdot \Delta f_1 + T_2 \cdot \Delta f_2$$

This has to be balanced by $T_c \cdot \Delta f_c$. It thus follows that $$T_c \cdot \Delta f_c = T_1 \cdot \Delta f_1 + T_2 \cdot \Delta f_2.$$

Time periods $T_1$ and $T_2$ are set to be sufficiently long to ensure reception of GSM sync and system data and are therefore known. The time periods $T_{PLL}1$ and $T_{PLL}2$ are essentially constant and it follows that the end of interval 57 (when reception of WCDMA signals resumes) is at a known point in time. $T_c$ is calculated working back from the end of interval 57 to the end of interval 55. The time period T2 may be increased or decreased, if required, in order to ensure that reconnection to the WCDMA requires at the desired time (i.e. the end of interval 57). It is a simple matter of design to ensure that $\Delta f_c$ is never so great as to cause the code phase of the receiver to drift outside the window W in FIG. 3. Ideally, therefore, there will be no difference between the cumulative frequency error for a period of time during which a GSM scan is performed and one in which the mobile unit simply remains in standby. In practice, manufacturing tolerances may introduce a slight difference, but those same tolerances will make the receiver well able to cope with any small differences, which may therefore be ignored.

As will have been appreciated from the foregoing description the reference oscillator is allowed temporarily to achieve phase lock with the new system so that the receiver can scan the GSM signal domain and receive GSM data with the correct phase, so that no post correction is required. This approach requires very little overhead in circuit complexity, memory space and energy consumption. The error estimation is determined before returning to the WCDMA system and applied during the receiver reconfiguration period, so that when the WCDMA system is re-acquired, the error is substantially reduced, if not completely eliminated.

Having thus described the invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

The invention claimed is:

1. A method of controlling a plural-mode receiver, capable of receiving signals from a first communication system or signals from a second, different communication system, to reduce frequency errors associated with the receiver scanning for signals of the second communication system while receiving signals of the first communication system, the method comprising:

changing parameters of a reference oscillator of the receiver so that the oscillator oscillates at frequencies related to signals of the second communication system;

recording the change in frequency of the oscillator resulting from the adjustment;

receiving signals of the second communication system for a period of time;

recording the period of time;

calculating from the recorded change and the recorded period of time an error vector; and changing parameters of the reference oscillator, including applying the calculated error vector, so that the oscillator oscillates at frequencies related to signals of the first communication system.

2. A method as claimed in claim 1, further comprising:

receiving data relating to the frequencies of signals of the second communication system;

determining from the received data the parameters of the reference oscillator to cause the oscillator to oscillate at approximately the frequencies related to signals of the second communication system.

3. A method as claimed in claim 2, further comprising:

receiving further data relating to the frequencies of signals of the second communication system;

determining from the received data corrections to be applied to the parameters of the reference oscillator to cause the oscillator to oscillate at substantially the frequencies related to signals of the second communication system.

4. A method as claimed in claim 3, wherein the recorded change in frequency includes the change associated with oscillating at approximately the frequencies related to signals of the second communication system and the change associated with oscillating at substantially the frequencies related to signals of the second communication system.

5. A method as claimed in claim 3 or 4, wherein the period of time comprises both time spent oscillating at approximately the frequencies related to signals of the second communication system and time spent oscillating at substantially the frequencies related to signals of the second communication system.

6. A method as claimed in claim 1, further comprising receiving signals of the of the second communication system containing information pertaining to the second system.

7. A method as claimed in claim 1, wherein the scanning is effected while the receiver is in an idle mode.

8. A plural-mode receiver apparatus for receiving signals from a first communication system or signals from a second, different communication system, the apparatus comprising:

a first receiver chain for receiving signals of the first communication system;

a second receiver chain for receiving signals of the second communication system;

a reference oscillator for generating a reference signal for the first receiver chain and the second receiver chain; and a controller for:

changing parameters of the reference oscillator so that the oscillator oscillates at frequencies related to signals of the second communication system;

recording the change in frequency of the oscillator resulting from the adjustment;

recording a period of time during which signals of the second communication system are received by the second receiver chain;

calculating from the recorded change and the recorded period of time an error vector; and changing parameters of the reference oscillator, including applying the calculated error vector, so that the oscillator oscillates at frequencies related to signals of the first communication system.

9. An apparatus as claimed in claim 8, further comprising means for receiving data relating to the frequencies of signals of the second communication system and wherein the controller is arranged to determine from the received data the parameters of the reference oscillator to cause the oscillator to oscillate at approximately the frequencies related to signals of the second communication system.

10. An apparatus as claimed in claim 9, further comprising means for receiving further data relating to the frequencies of signals of the second communication system, and wherein the controller is arranged to determine from the received data corrections to be applied to the parameters of the reference oscillator to cause the oscillator to oscillate at substantially the frequencies related to signals of the second communication system.

11. An apparatus as claimed in claim 10, wherein controller is arranged to record changes in frequency that include the change associated with oscillating at approximately the frequencies related to signals of the second communication system and the change associated with oscillating at substantially the frequencies related to signals of the second communication system.

12. An apparatus as claimed in claim 10 or 11, wherein controller is arranged to calculate the period of time from both time spent oscillating at approximately the frequencies related to signals of the second communication system and time spent oscillating at substantially the frequencies related to signals of the second communication system.

13. An apparatus as claimed in claim 8, wherein the controller is operable while the receiver is in an idle mode.

14. A receiver for receiving signals of a first communication system and signals of a second communication system, the receiver comprising a receiving circuit tunable to receive signals of the first and second communication systems, the receiver being arranged so that, while tuned to receive signals of the first communication system, the receiving circuit can be briefly retuned to receive signals of the second communication system before being tuned back to receive again signals of the first communication system, and so that a correction is made when tuning back to signals of the first communication system depending on tuning changes made while retuning and receiving signals of the second communication system and the duration of the changes.

15. A receiver as claimed in claim 14, wherein the receiving circuit comprises a first receiver chain operable to receive signals from a first communications system and a second receiver chain operable to receive signals from a second communications system.

16. A receiver as claimed in claim 15, further comprising a phase-locked loop circuit associated with the first receiver chain and with the second receiver chain.

17. A receiver as claimed in claim 16, wherein the phase-locked loop circuit comprises a single phase-locked loop configurable to output a signal at a first frequency related with signals of the first communications system or to output a signal at a second frequency related with signals of the second communications system.

18. A receiver as claimed in claim 16 or 17, wherein the phase-locked loop circuit comprises a voltage-controlled temperature-compensated crystal oscillator (VCTCXO) to which the correction is made.

19. A receiver as claimed in claim 15, wherein the first receiver chain is configured to receive signals of a continuous frequency division duplex system.

20. A receiver as claimed in claim 15, wherein the second receiver chain is configured to receive signals of a time division duplex system.

21. A receiver as claimed in claim 19, wherein the first receiver chain is configured to receive WCDMA signals.

22. A receiver as claimed in claim 20, wherein the second receiver chain is configured to receive GSM signals.

23. A receiver as claimed in claim 15, further comprising a controller for controlling the receiver circuit to cause the same to tune between the signals of the first and second communication systems.

24. A receiver as claimed in claim 23, wherein the controller is operable to calculate the correction from the tuning changes made while retuning and receiving signals of the second communication system and the duration of the changes and to apply the correction to the receiver circuit.

25. A method of receiving signals of a first communication system and signals of a second communication system, the method comprising tuning a receiving circuit to receive signals of the first communication system, retuning the receiver circuit to receive signals of the second communication system, tuning the receiver back to receive again signals of the first communication system, determining tuning changes made while retuning and receiving signals of the second communication system and the duration of the changes, calculating from the changes and duration of the changes a correction to be made to the tuning, and making the calculated correction when tuning back to signals of the first communication system.

26. An apparatus for controlling a plural-mode receiver, capable of receiving signals from a first communication system or signals from a second, different communication system, to reduce frequency errors associated with the receiver scanning for signals of the second communication system while receiving signals of the first communication system, comprising:
 means for changing parameters of a reference oscillator of the receiver so that the oscillator oscillates at frequencies related to signals of the second communication system;
 means for recording the change in frequency of the oscillator resulting from the adjustment;
 means for receiving signals of the second communication system for a period of time;
 means for recording the period of time;
 means for calculating from the recorded change and the recorded period of time an error vector; and
 means for changing parameters of the reference oscillator, including applying the calculated error vector, so that the oscillator oscillates at frequencies related to signals of the first communication system.

27. The apparatus as claimed in claim 26, further comprising:
 means for receiving data relating to the frequencies of signals of the second communication system;
 means for determining from the received data the parameters of the reference oscillator to cause the oscillator to oscillate at approximately the frequencies related to signals of the second communication system.

28. The apparatus as claimed in claim 27, further comprising:
 means for receiving further data relating to the frequencies of signals of the second communication system;
 means for determining from the received data corrections to be applied to the parameters of the reference oscillator to cause the oscillator to oscillate at substantially the frequencies related to signals of the second communication system.

29. The apparatus as claimed in claim 28, wherein the recorded change in frequency includes the change associated with oscillating at approximately the frequencies related to signals of the second communication system and the change associated with oscillating at substantially the frequencies related to signals of the second communication system.

30. The apparatus as claimed in claim 28, wherein the period of time comprises both time spent oscillating at approximately the frequencies related to signals of the second communication system and time spent oscillating at substantially the frequencies related to signals of the second communication system.

31. The apparatus as claimed in claim 26, wherein the signals of the of the second communication system contain information pertaining to the second system.

32. The apparatus as claimed in claim 26, wherein the scanning is effected while the receiver is in an idle mode.

33. An apparatus for receiving signals of a first communication system and signals of a second communication system, the apparatus comprising means for tuning a receiving circuit to receive signals of the first communication system, means for retuning the receiver circuit to receive signals of the second communication system, means for tuning the receiver back to receive again signals of the first communication system, means for determining tuning changes made while retuning and receiving signals of the second communication system and the duration of the changes, means for calculating from the changes and duration of the changes a correction to be made to the tuning, and means for making the calculated correction when tuning back to signals of the first communication system.

* * * * *